United States Patent [19]
Suh

[11] Patent Number: 5,822,261
[45] Date of Patent: Oct. 13, 1998

[54] SEMICONDUCTOR MEMORY DEVICE WITH INCREASED BANDWIDTH

[75] Inventor: Jung Won Suh, Ichon, Rep. of Korea

[73] Assignee: Hyundai Electronics Industries Co., Ltd., Ichon, Rep. of Korea

[21] Appl. No.: 777,178

[22] Filed: Dec. 27, 1996

[30] Foreign Application Priority Data

Dec. 29, 1995 [KR] Rep. of Korea ............... 1995-66057

[51] Int. Cl.$^6$ ................................................ G11C 7/02
[52] U.S. Cl. ................... 365/207; 365/205; 365/230.03; 365/63
[58] Field of Search .................................... 365/207, 205, 365/230.03, 63, 51

[56] References Cited

U.S. PATENT DOCUMENTS

| | | |
|---|---|---|
| 5,226,009 | 7/1993 | Arimoto . |
| 5,291,444 | 3/1994 | Scott et al. . |
| 5,610,855 | 3/1997 | Komuro ............................ 365/207 X |
| 5,636,174 | 6/1997 | Rao ................................ 365/230.03 X |
| 5,648,928 | 7/1997 | Yoon et al. ................................ 365/63 |
| 5,650,972 | 7/1997 | Tomishima et al. ................... 365/207 |
| 5,652,726 | 7/1997 | Tsukude et al. ....................... 365/205 |
| 5,666,319 | 9/1997 | Okamura ................................ 365/205 |
| 5,671,188 | 9/1997 | Patel et al. ............................. 365/205 |

Primary Examiner—Huan Hoang
Attorney, Agent, or Firm—Thelen Reid & Priest LLP

[57] ABSTRACT

The present invention relates to a semiconductor memory device having a data bus line structure suitable for a high-speed burst read/write operation, and more particularly, to a semiconductor memory device capable of operating a high-speed burst read/write by displacing to pass a plurality of data buses over a cell array and sense amplifier array and pre-reading data of a plurality of sense amplifiers in a local data bus sense amplifier at the same time. A semiconductor memory device of the present invention comprises: a bit line sense amplifier array composed of K bit line sense amplifiers divided into $2^n$ in a column direction; $K/2^n$ local data bus lines held in common on the bit line sense amplifier array of the same column direction and displaced to pass over a cell array and the bit line sense amplifier array; a sub column decoder connected to the bit line sense amplifier array so that one bit line sense amplifier per $2^n$ bit line sense amplifiers on each bit line sense amplifier array can be connected with the local data bus lines; a switch means being so that the bit line sense amplifier selected by an output of the $2^n$ sub decoders per each bit line sense amplifier array can be connected with the local data bus line; and $K/2^n$ data bus sense amplifiers connected to the $K/2^n$ local data lines to pre-read $K/2^n$ bit line sense amplifier data selected by the column decoder output.

14 Claims, 10 Drawing Sheets

SEMICONDUCTOR MEMORY DEVICE WITH INCREASED BANDWIDTH

BACKGROUND OF THE INVENTION

1. Field of the Invention

The present invention relates to a semiconductor memory device having a data bus line structure suitable for a high-speed burst read/write operation and, more particularly, to a semiconductor memory device with increased bandwidth capable of operating a high-speed burst read/write by displacing to pass a plurality of data buses over a cell array and sense amplifier array and pre-reading data of a plurality of sense amplifiers in a local data bus sense amplifier at the same time.

2. Description of the Prior Art

In general, in comparison to an operative speed of a microprocessor, since state memory operation is at a low-speed, it is limited to improve an efficiency in the overall system. Recently, it has been found that a remarkable rambus DRAM or high-speed synchronous DRAM (hereinafter referred to SDRAM) considerably increases a bandwidth (herein, a bandwidth is a bus operative frequency×a data bus width) and an operative speed as compared to a conventional Dynamic Random Access Memory (hereinafter, 'DRAM'). However, various problems are expected to embody a rambus DRAM or a high-speed SDRAM for a gigabit DRAM. One of the problems is that a READ/WRITE data bus structure doesn't satisfy required conditions of a high-speed/high-bandwidth as a current data bus structure.

A conventional local data bus structure is composed of a horizontal local data bus and vertical local data bus in which only a portion of data stored in a Bit Line Sense Amplifier (hereinafter referred to a 'BLSA') array is transferred to a Data Bus Sense Amplifier (hereinafter referred to 'DBSA') through a horizontal local data bus by means of GYi signal, that is, an output signal of a main column decoder past over a cell array on a metal line, and a data sensed in DBSA is transferred to a Global Data Bus through a vertical local data bus. On the other hand, a vertical local data bus is displaced over a Sub Word Line Driver essentially capable of alleviating a metal pitch after 64 Mb DRAM, therefore, limiting the number of accessible BLSA simultaneously. Additionally, the greater the improvement of an integrated degree of a memory is, the longer the length of GYi signal line is, as a result, it is a restricted element for decreasing a column access time.

Figure 1:
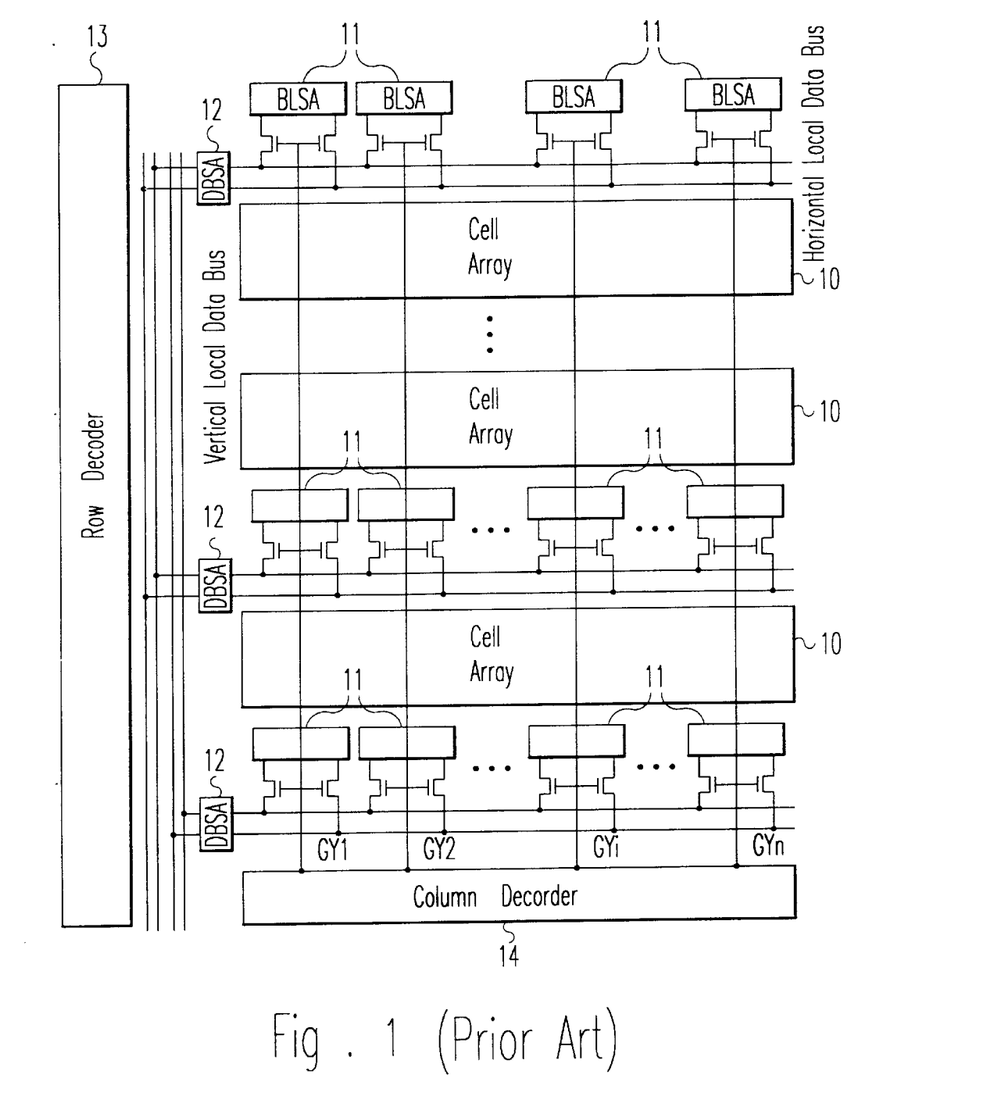
FIG. 1 is a circuit view of a DRAM having a conventional data bus structure.

Hereinafter, the present invention will be described in detail with reference to a semiconductor memory device having a conventional data bus structure shown in FIG. 1.

A BLSA selected by as GYi signal of an output signal of a column decoder transfers a data to a horizontal local data bus, and a DBSA stores by sensing a transferred data. A data stored in DBSA is transferred to a global data bus through a vertical local data bus. Accordingly, in a conventional local data bus structure, the number of BLSA is limited to 2 to 4, simultaneously being accessed at every active word line.

Figure 2:
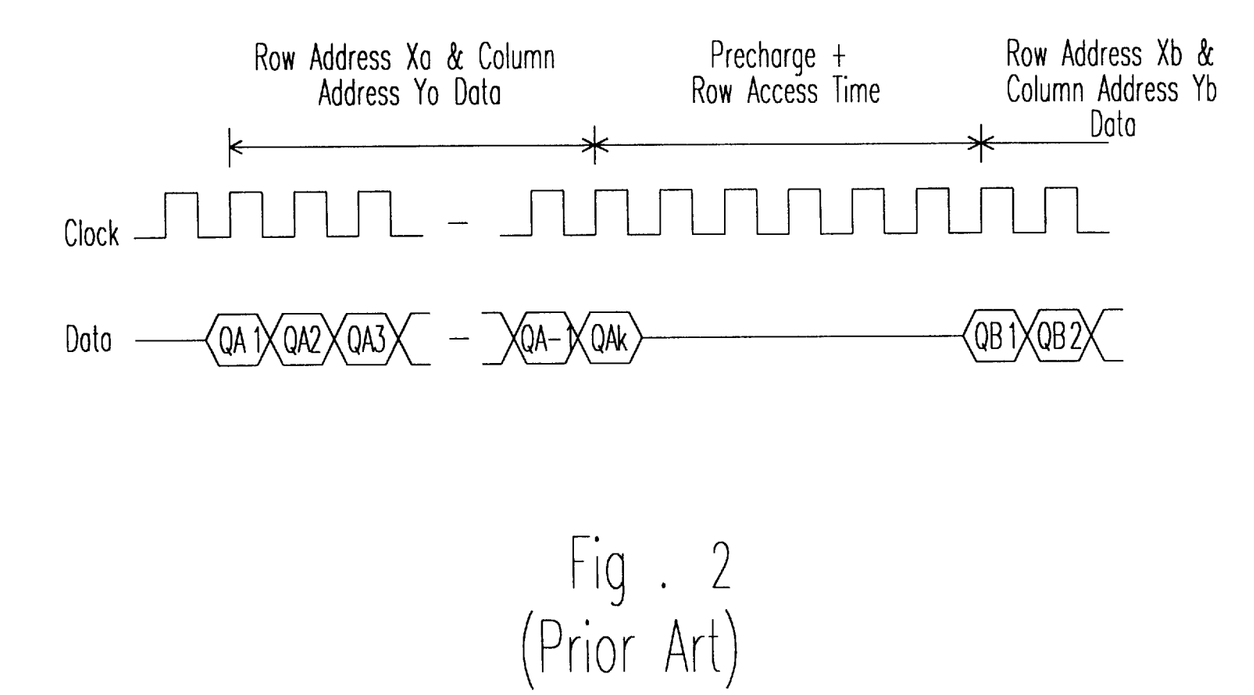
FIG. 2 is a conventional burst read timing view to 2 continuous row addresses.

FIG. 2 is a conventional burst READ timing view to 2 continuous row addresses (Xa & Xb).

In a current SDRAM, there is required a precharged row access time between a burst data (QAi, $1 \leq i \leq k$) by means of a row address Xa and a column address Ya and a burst data (QBi, $1 \leq i \leq k$) by means of a row address Xa and a column address YB in the case that access to 2 row addresses (Xa & Xb) is continuously performed in the same bank, therefore, deteriorating a burst read efficiency of DRAM.

SUMMARY OF THE INVENTION

Accordingly, the present invention is directed to a semiconductor memory device having a data bus line structure suitable for a high-speed burst read/write operation that substantially obviates one or more of the problems due to limitations and disadvantages of the related art.

An object of the present invention is to provide a semiconductor memory device having a data bus line structure suitable for a high-speed burst read/write operation capable of operating a high-speed burst read/write displacing to pass a plurality of data buses over a cell array and sense amplifier array and pre-reading data of a plurality of sense amplifier array in a local data bus sense amplifier at the same time.

Additional features and advantages of the invention will be set forth in the description which follows, and in part will be apparent from the description, or may be learned by practices of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a semiconductor memory device, said device comprising: a bit line sense amplifier array composed of K bit line sense amplifiers divided into $2^n$ in a column direction; $K/2^n$ local data bus lines held in common on said bit line sense amplifier array of said same column direction and displaced to pass over a cell array and said bit line sense amplifier array; a sub column decoder connected to said bit line sense amplifier array so that one bit line sense amplifier $2^n$ bit line sense amplifiers on said each bit line sense amplifier array can be connected with said local data bus lines; a switch means being so connected with said local data bus lines; a switch means being so said bit line sense amplifier selected by an output of said $2^n$ sub column decoders per said each bit line sense amplifier array can be connected with said local data bus line; and $K/2^n$ local data lines to pre-read $K/2^n$ bit line sense amplifier selected by said column decoder output.

In another aspect, the present invention provides a semiconductor memory device, said device comprising: a bit line sense amplifier array composed of K bit line sense amplifiers divided into $2^n$ in a column direction; all $2K/2^n$ local data bus lines having said bit line sense amplifier group of the same column direction every array in common and displaced to pass over a cell array and said bit line sense amplifier array; a sub column decoder connected to both sides of said cell array so that one bit line sense amplifier per $2^n$ on said each bit line sense amplifier array can be connected with said local data bus line;

a switch means so that said bit line sense amplifier selected by an output of said $2^n$ sub column decoders per said each bit line sense amplifier array can be connected with said local data bus line; and $2K/2^n$ bus sense amplifiers connected to said $2K/2^n$ local data lines to pre-read $2K/2^n$ bit line sense amplifier data selected by said column decoder output.

In another aspect, the present invention provides a semiconductor memory device for performing a burst read operation for 2 continuous row addresses, said device comprising: a data of said previous row address being pre-read in said data bus sense amplifier, next burst read operation being continuously performed after first burst read by performing access to data of said next row address through precharged state during a burst read operation, in order to perform a continuous burst read operation without interrupting between burst data by means of a previous row address and a next row address.

In another aspect, the present invention provides a semiconductor memory device having a data bus sense amplifier array composed of m×n data bus sense amplifiers said device comprising: one block being divided into m data bus sense amplifier block by regarding n data bus sense amplifiers holding an output of a column decoder in common as one clock; n bit line sense amplifiers pertaining to said data bus sense amplifier block transferring the stored data by being simultaneously connected to n global data buses by an output of said column decoder; and said transferred data having a data read path transferred to a data pin through a data output driver after it is received on a read data buffer.

In another aspect, the present invention provides a semiconductor memory device having a data bus sense amplifier array composed o m×2n data bus sense amplifiers, said device comprising: one block being divided into m data bus sense amplifier block by regarding 2n data bus sense amplifiers holding an output of an column decoder in common as one block; n data bus sense amplifiers among 2n bit line sense amplifiers pertaining to said data bus amplifier block transferring the stored data by being simultaneously connected to n global data buses by means of the output of said column decoder and an output selector; and said transferred data comprising a data read path transferred to a data pin through a data output driver after it is received on a read data buffer.

In another aspect, the present invention provides a semiconductor memory device, having m×n write data drivers for m×n local data buses, wherein n write data drivers holding an output of a column decoder in common are divided into m write data driver blocks by becoming one block, n write data drivers pertaining to said write data driver block continuously perform a write operation by being simultaneously connected to a global data bus by means of said column decoder and driving to a local data bus data transferred through said global data bus from a data pin.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide further understanding of the invention and are incorporated in and constitute a part of this specification, illustrate embodiments of the invention and together with the description serve to explain the principles of the drawings.

In the drawings.

DETAILED DESCRIPTION OF PREFERRED EMBODIMENT

Reference will now be made in detail to the preferred embodiments of the present invention, examples of which are illustrated in the accompanying drawings.

Figure 3:
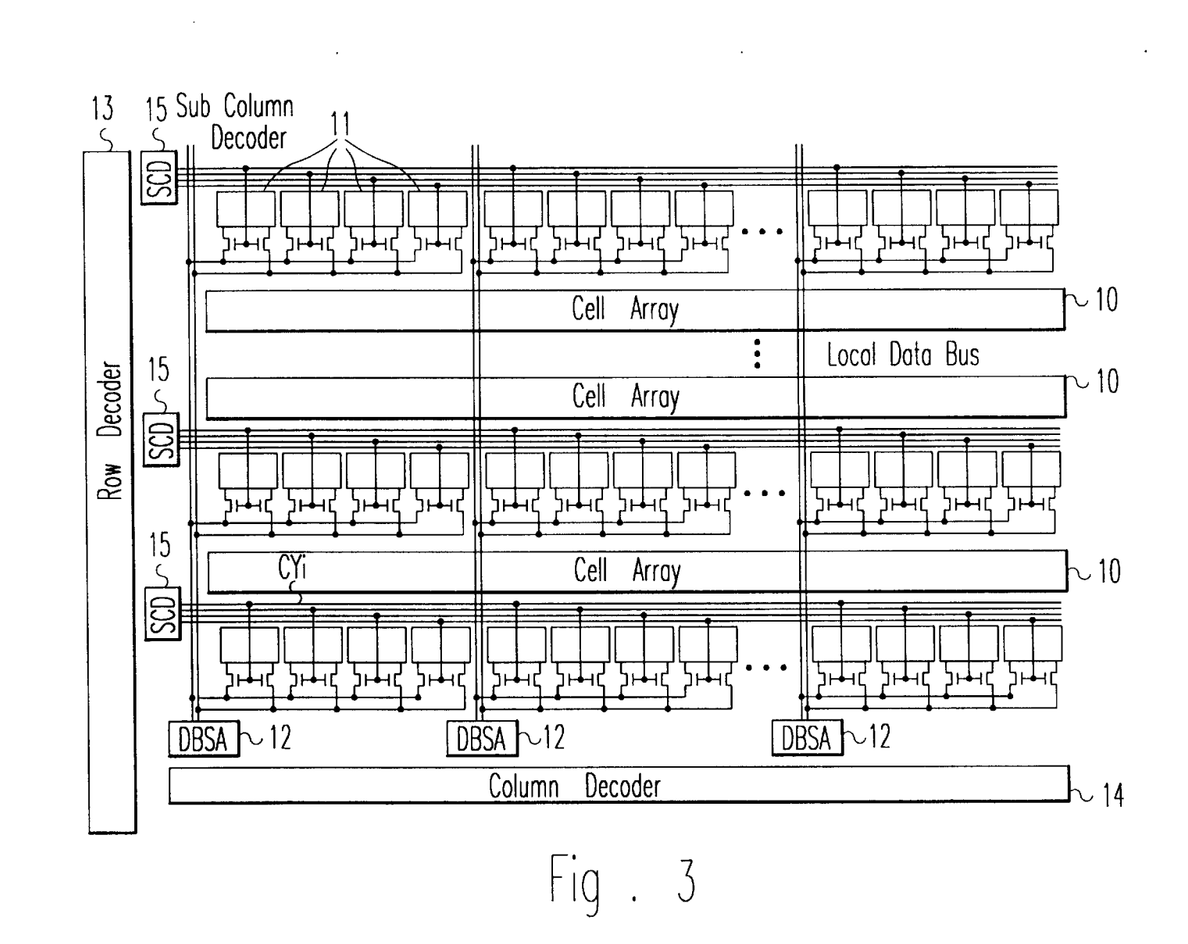
FIG. 3 is a circuit view of a DRAM having a data bus line structure suitable to a burst read/write operation by means of the first embodiment of the present invention/

FIG. 3 is a circuit view of a DRAM having a data bus line structure suitable to a burst read/write operation by means of a first embodiment of the present invention. Each BLSA 11 array is divided into $2^n$ in the column direction and there is a structure displacing local data buses of the respective 1 pair (2 lines) above the array.

Each BLSA 11 array is divided into 4 ($=2^n$) in FIG. 3 and it can be divided into 1=($2^0$), 2($=2^1$), 8($=2^3$) if necessary. Each local data bus (composed of 2 lines), is used in common in BLSA 11 group of in the same column direction, passes over a cell array 10, only a BLSA 11 selected by an output signal, LiYi, of a Sub Column Decoder (hereinafter 'SCD') 15 passing through a horizontal direction is connected with a local data bus. A data transferred direction is connected with a local data bus. A data transferred to a local data bus is latched after being sensed by DBSA 12 connected to the respective local data bus. Herein, DBSA 12 is composed of a portion of sensing a data loaded on a local data bus and a portion of latching a data, which performs the function of a kind of cache memory. (The circuit of DBSA 12 can be embodied by various methods, therefore, this application doesn't provide a specific circuit.)

Accordingly, when the number of cells connected to word line is 2K, simultaneously a data stored on BLSA 11 array is prefetched on DBSA of $K/2^n$ through a local data bus of $K/2^n$ (K/4 in FIG. 3). Then, only a data of DBSA 12 designated by the output of a column decoder 14 is transferred to a data output driver through a global data bus.

In a conventional data bus structure, since necessary data is stored on BLSA array, a necessary BLSA 11 is selected by a GY1 signal, that is, an output of a main column decoder and of a long metal line. Then, column access time becomes longer because of reading a data through a long vertical local data bus. However, in the present invention, a necessary data is prefetched on DBSA 12 array adjacent to the column decoder 14, and access to a column can be quickly performed and a high-speed burst read operation can be performed.

Figure 4:
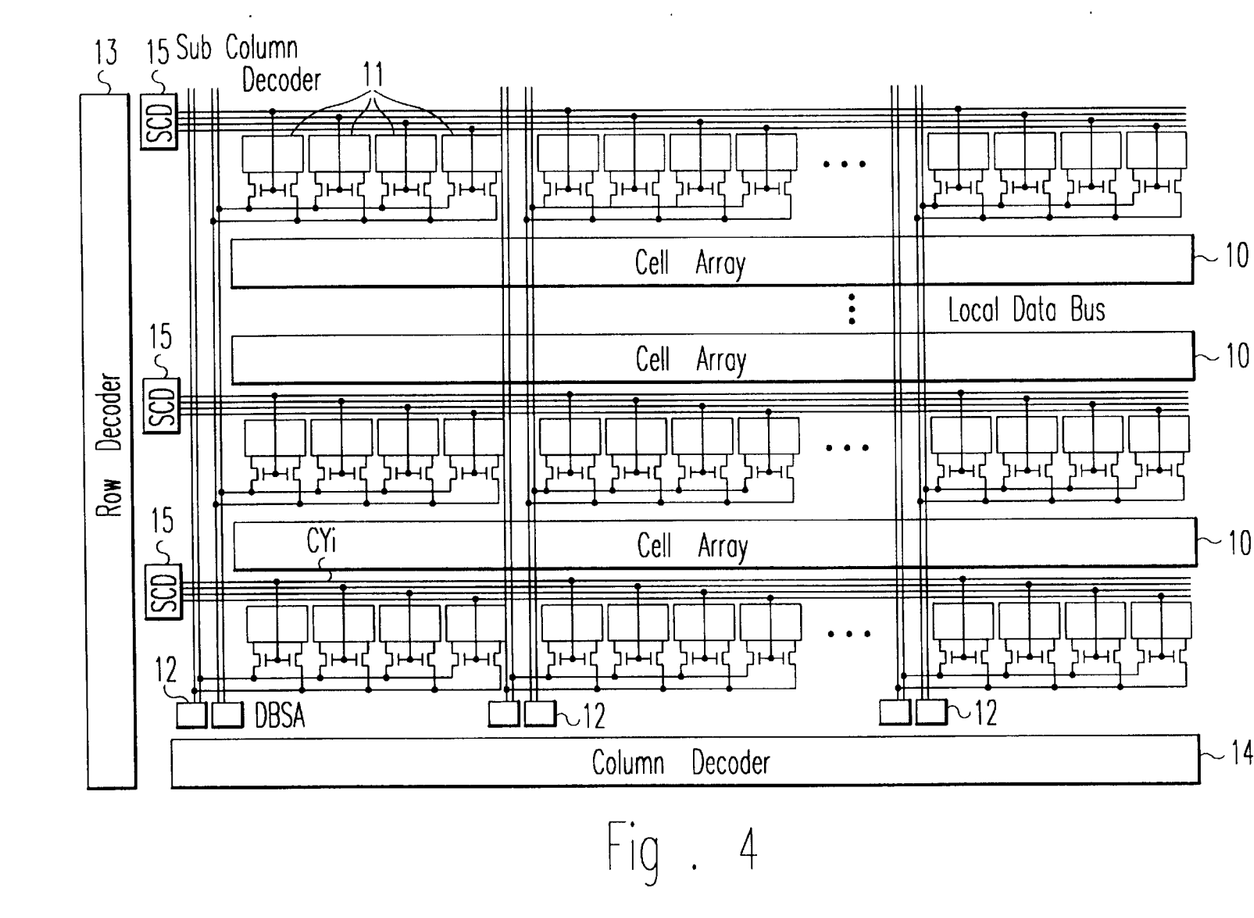
FIG. 4 is a circuit view of DRAM having a data bus line structure suitable for a high-speed burst read/write operation by means of the second embodiment of the present invention.

FIG. 4 is a circuit view of DRAM having a data bus line structure suitable for high-speed burst read/write operation by means of the second embodiment of the present invention. Each BLSA 11 array is divided into $2^n$ in the column direction, and a structure displacing a local data bus at every 2 pair (4 lines) over each array.

In FIG. 4, each BLSA 11 array is divide into 4($=2^2$), and can be divided into 2=($=2^1$), or 8($=2^3$) if necessary. The local data bus of 2 pairs passes over a cell array, and is used in common at every BLSA 11 group of the same column direction.

Only BLSA selected by an output (LYi) of a Sub Column Decoder (SCD) 15 passing a horizontal direction is connected to a local data bus. FIG. 3 shows activation of one SCDs 15 of a cell array 10 pertaining to an access word line, but FIG. 4 shows activating simultaneously both SCDs. That is, since data on both BLSA arrays of a cell array an activated word line pertains to are latched, the embodiment of FIG. 3 which a local data bus is used in common activates only SCD of one side, the embodiment of FIG. 4 which local data bus is divided into 2 pairs. Data transferred to a local data bus are latched after being sensed by DBSA 12 connected to each local data bus.

Accordingly, when the number of cells connected to a word line 2K, data stored on BLSA array through a local data bus of $2K/2^n$ ($2K/4$ in FIG. 4) are prefetched on DBSAs of $2K/2^n$. Then, only data of DBSA 12 selected by an output GYi of a column decoder 14 are transferred to a data output driver through a global data bus.

Figure 5:
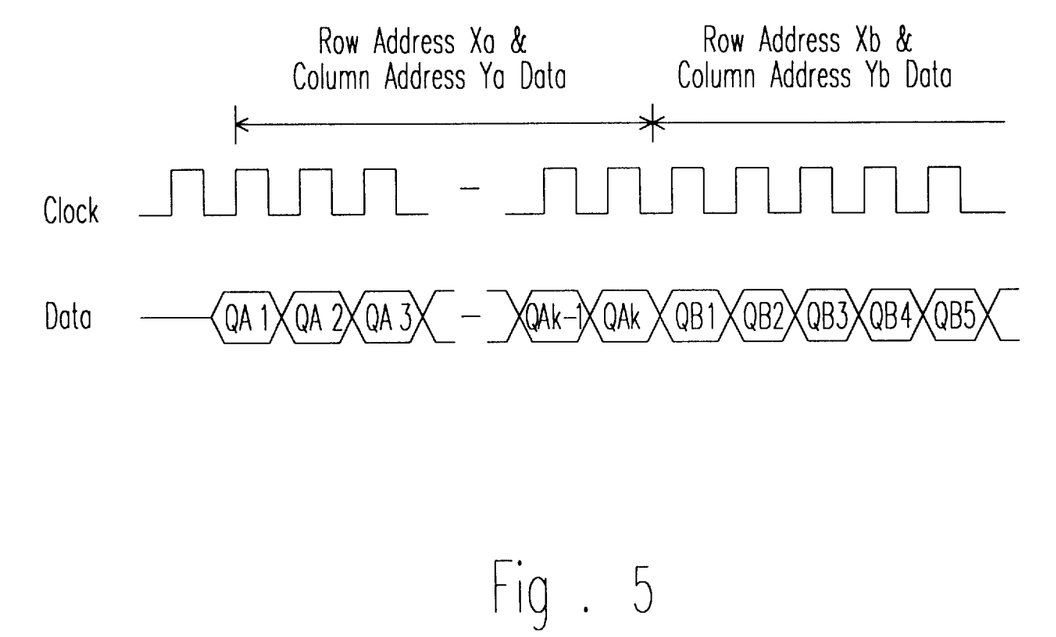
FIG. 5 is a timing view of a burst read according to the present invention to 2 continuous row addresses.

FIG. 5 is a burst read timing device of the present invention to 2 continuous row addresses. Different from a conventional timing view (FIG. 2), a burst read operation is possible continuously without interruption between burst data (QAi, $1 \leq i \leq k$) by means of a row address Xa and a column address Ya, and burst data (QB, $1 \leq i \leq k$) by means of a row address Xb and a column address Yb.

This is because access to the data of the row address Xb can be performed through a precharged state after the data of the row address Xa is prefetched on DBSA array. Since the burst read operation described above is possible in the case that access to a row address is continuously performed, it doesn't deteriorate the efficiency due to access to a continuous row address.

Figure 6A:
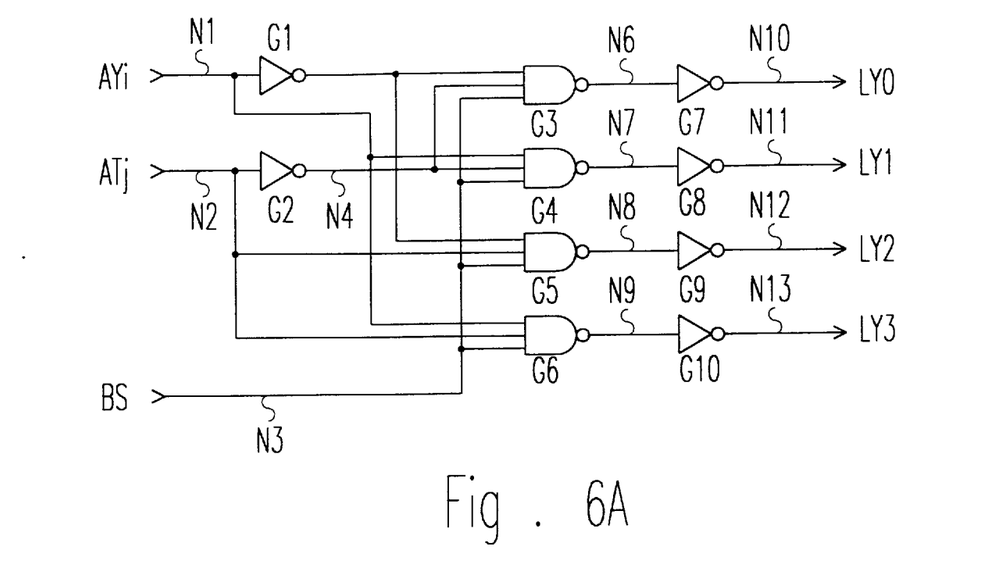
FIG. 6A is the first embodiment circuit view of a sub column decoder shown in FIGS. 3 and 4.

FIG. 6A is the first embodiment circuit view of a sub column decoder shown in FIGS. 3 and 4, which is composed of a first, second node N1, N2 receiving column address signals AYi, AYj, a third 3 node N3 receiving a block selective signal BS, an inverter G1 connected between the first node Ni and a fourth node N4, an invertor G2 connected between the second node N2 and a fifth node N5, a NAND gate G3 transferring to a sixth node N6 by NAND-counting signals of the 4,5,3 nodes N4,N5,N3, and NAND gate G4 transferring to a seventh node N7 by NAND-counting signals of the 1,5,3 nodes N1,N5,N3, a NAND gate G6 transferring to a ninth node N9 by NAND-counting signals of the 1,2,3 nodes N1,N2,N3, an invertor G7 connected to between the sixth node N6 and a tenth node N10 transferring LY0 signal an output of a sub column decoder, an inverter G8 connected to between the seventh node N7 and an eleventh node N11 transferring LY1 signal of an output of a sub column decoder, an inverter G9 connected to between the eight node N8 and a twelfth node N12 transferring LY2 signal an output of a sub column decoder, and an inverter G10 connected to between the ninth node N9 and a thirteenth node N13 transferring LY3 signal of an output of a sub column decoder.

When each BLSA array is divided into $2^n$, column addresses of the number of n are received, resulting in producing LYi ($0 \leq i \leq 2^n-1$). It is selective to operate a sub column decoder (SCD) which receives a block selective signal (BS) activated of a selected cell array.

Figure 6B:
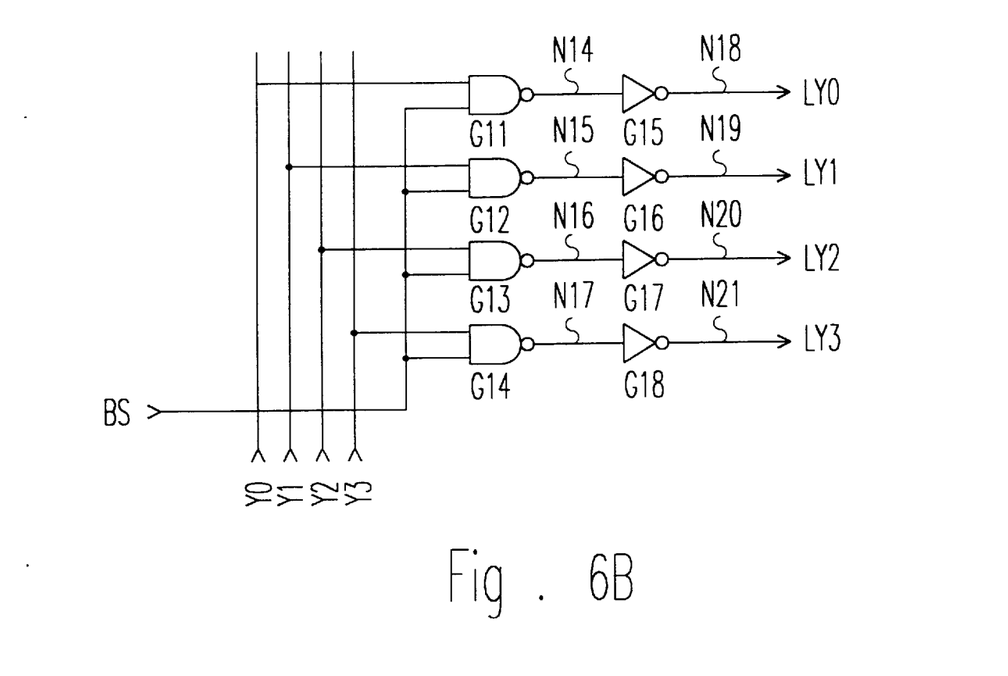
FIG. 6B is the second embodiment circuit view of a sub column decoder shown in FIGS. 3 and 4.

FIG. 6B is the second embodiment circuit view of a sub column decoder shown in FIGS. 3 and 4, which is composed of a NAND gate G11 transferring to a fourteenth node N14 the NAND-counting value by receiving an address signal Y0 and block selective signal BS, a NAND gate G12 transferring to a fifteenth node n15 and NAND-counting value by receiving an address signal Y1 and block selective signal BS, a NAND gate G13 transferring to a sixteenth node N16 the NAND-counting value byh receiving an address signal Y2 and block selective signal BS, a NAND gate G14 transferring to a seventeenth node N17 the NAND-counting value by receiving an address signal Y3 and block selective signal BS, an inverter G15 connected between the fourteenth node N14 and an eighteenth node N18 transferring an output signal LYO of a sub column decoder, an inverter G16 connected between the fifteenth node N15 and a nineteenth node N19 transferring an output signal LY1 of a sub column decoder, an inverter G17 connected between the sixteenth node N16 and a twentieth node N20 transferring an output signal LY2 of a sub column decoder, and an inverter G18 connected between the seventeenth node N17 and a twenty-first node N21 transferring an output signal LY3 of a bus column decoder.

If each BLSA array is divided into $2^1$, n column addresses are decoded, resulting in producing Yi ($0 \leq i \leq 2^n-1$). All sub column decoders (SCD) hold a column decoder output Yi in common. A sub column decoder regarding an activated BS signal of a cell array selected as an input signal operates by receiving a column decoder output signal Yi ($0 \leq i \leq 2^n-1$) as an input.

Figure 7:
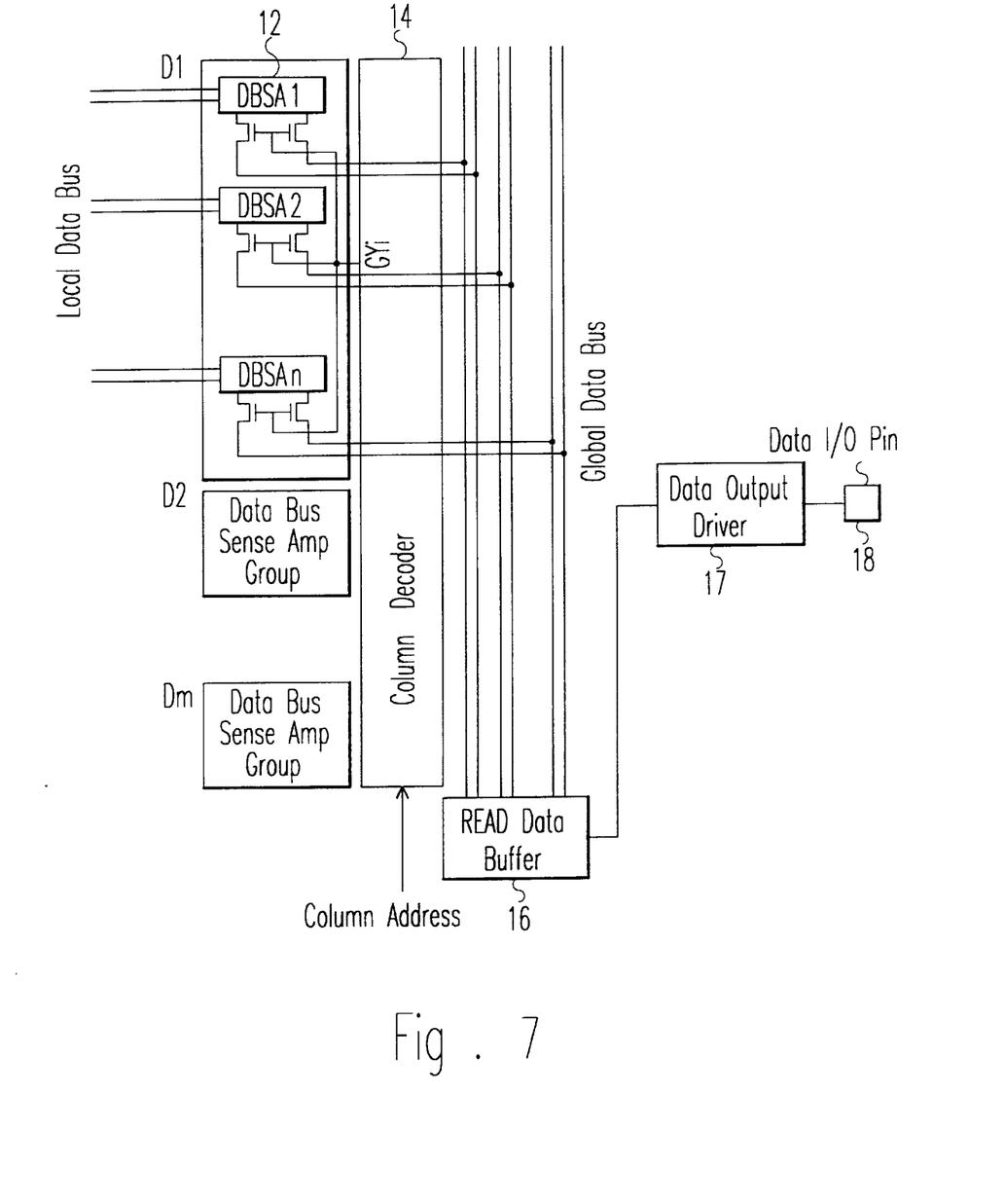
FIG. 7 is a circuit view showing a first embodiment of a data read path of the present invention.

FIG. 7 is a circuit view showing a first embodiment of a data read path of the present invention.

The overall data base sense amplifier DBSA array (DBSA of the number m×n) is divided into m DBSA blocks Di ($1 \leq i \leq m$) by n DBSAs holding an output GYi of a column decoder 14 in common. Accordingly, n DBSAs among 2n BLSAs send the stored data by being simultaneously connected to a global data bus by means of GYi and OS signals. The transferred data is sent to a data pin 18 through a data output driver 17 after being received by a read data buffer 16.

Figure 8:
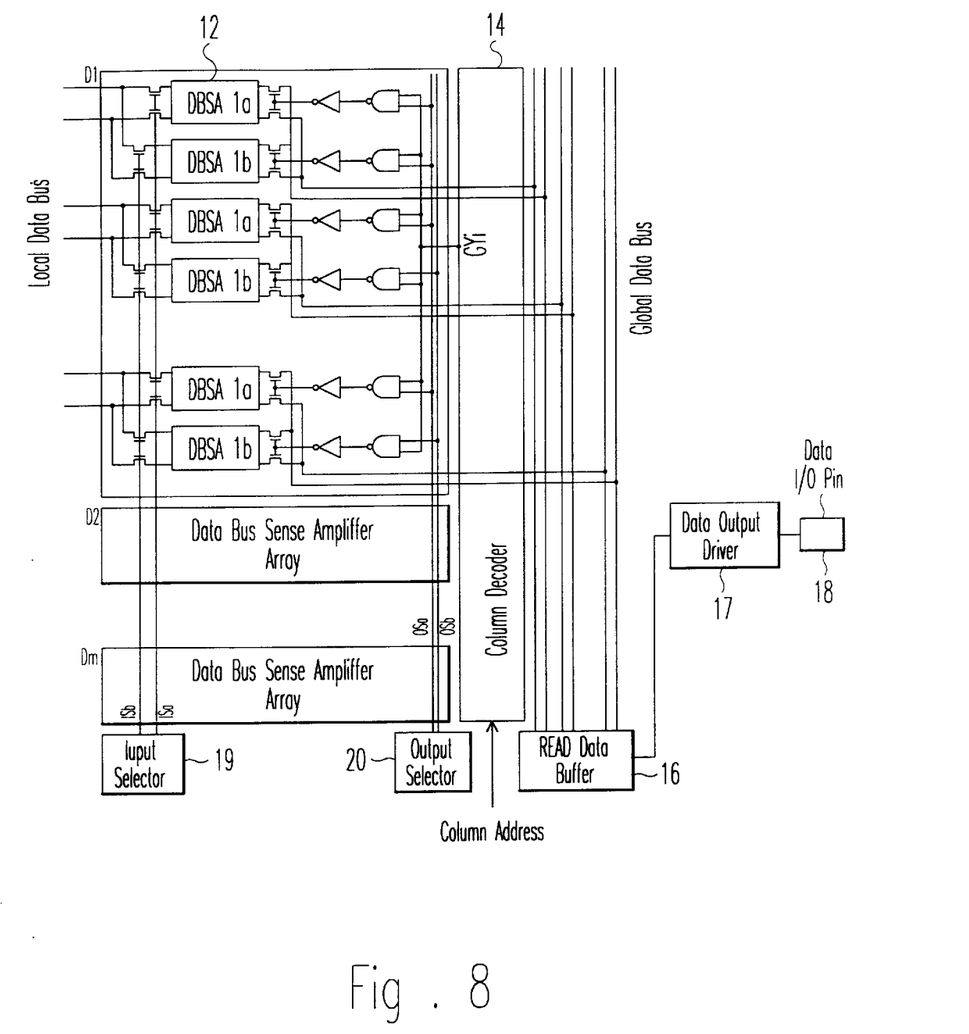
FIG. 8 is a circuit showing a second embodiment of a data read path of the present invention.

FIG. 8 is different from FIG. 7 in that the connection is controlled by an input selector 19 and output selector 20 since each local data bus has 2 DBSAs. That is, since each DBSA block has two DBSA groups divided into an a group and b group, the prefetch operation is performed from a local data bus to DBSA array in parallel with connecting to a global data bus from DBSA array. While READ operation for one DBSA group is performed, the other DBSA group can read data in a Full Page Mode by receiving a data from a local data bus without collision of data. (Full Page Mode is a mode which reads/writes all cell data connected to a word line.)

Figure 9A:
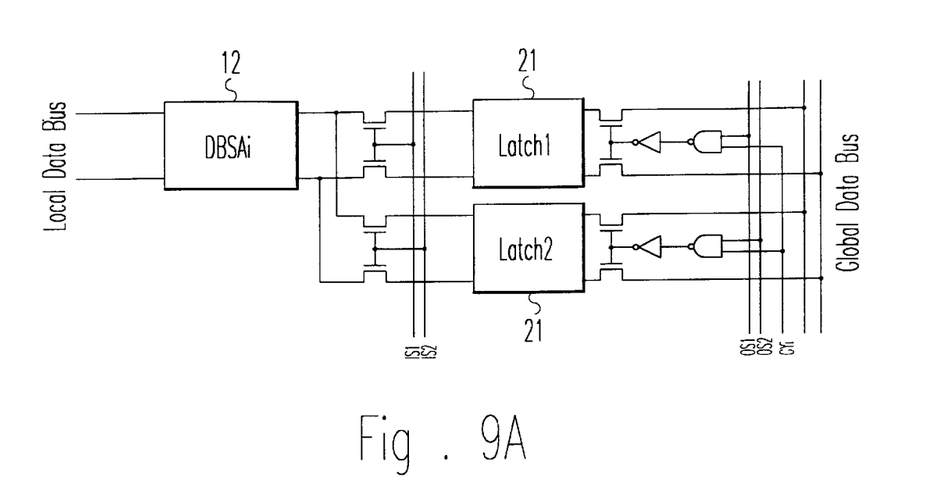
FIG. 9A is a circuit view showing a third embodiment of a data read path of the present invention.

FIG. 9A, which is a circuit view showing a third embodiment of a data read path of the present invention, shows only the distinguished DBSA portion except the portion identical to FIG. 8.

In FIG. 8, each local data bus has 2 DBSAs, while in FIG. 9A, the connection is controlled by ISi (i=1,2) and OSi (i=1,2) signal since each DBSA has 2 latches 21.

Just like FIG. 8, the prefetch operation can be performed from a local data bus to a latch array in parallel with connecting to a global data bus from a latch array. That is, the prefetch operation is performed since one latch of two latches is connected to each DBSA by ISi signal, and the other latch is connected to a global data bus by OSi signal.

Figure 9B:
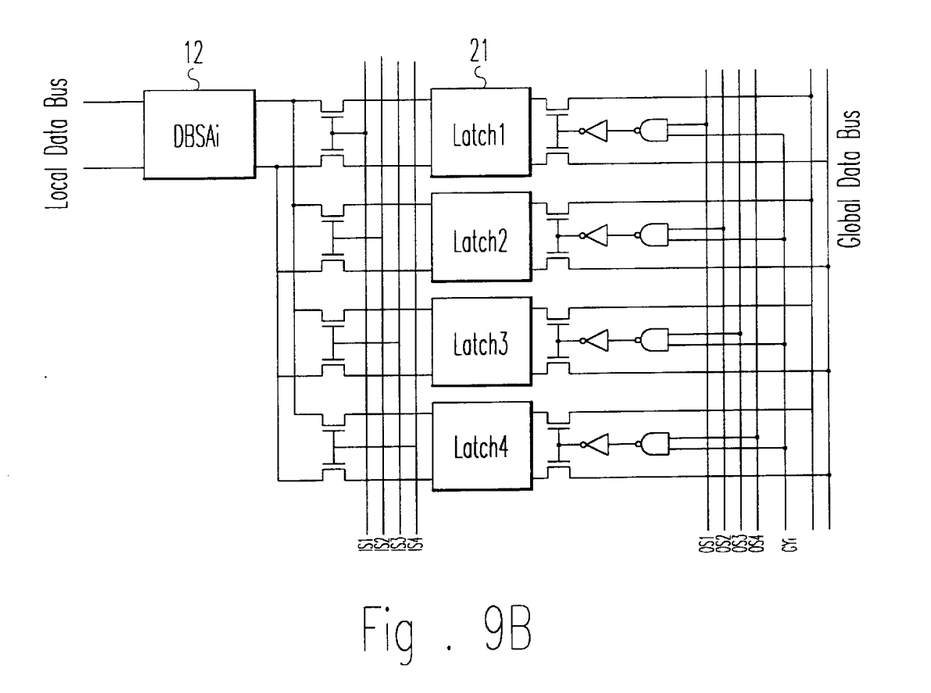
FIG. 9B is a circuit view showing a fourth embodiment of a data read path of present invention.

FIG. 9B is a circuit view showing a fourth embodiment of a data read path of the present invention. The connection of read operation is controlled by ISi (i=1,2,3,4) and OSi (i=1,2,3,4) signal since each DBSA has 4 latches.

Similarly, the prefetch operation can be performed from a local data bus to a latch array in parallel with connecting to a global data bus from a latch array.

Figure 10:
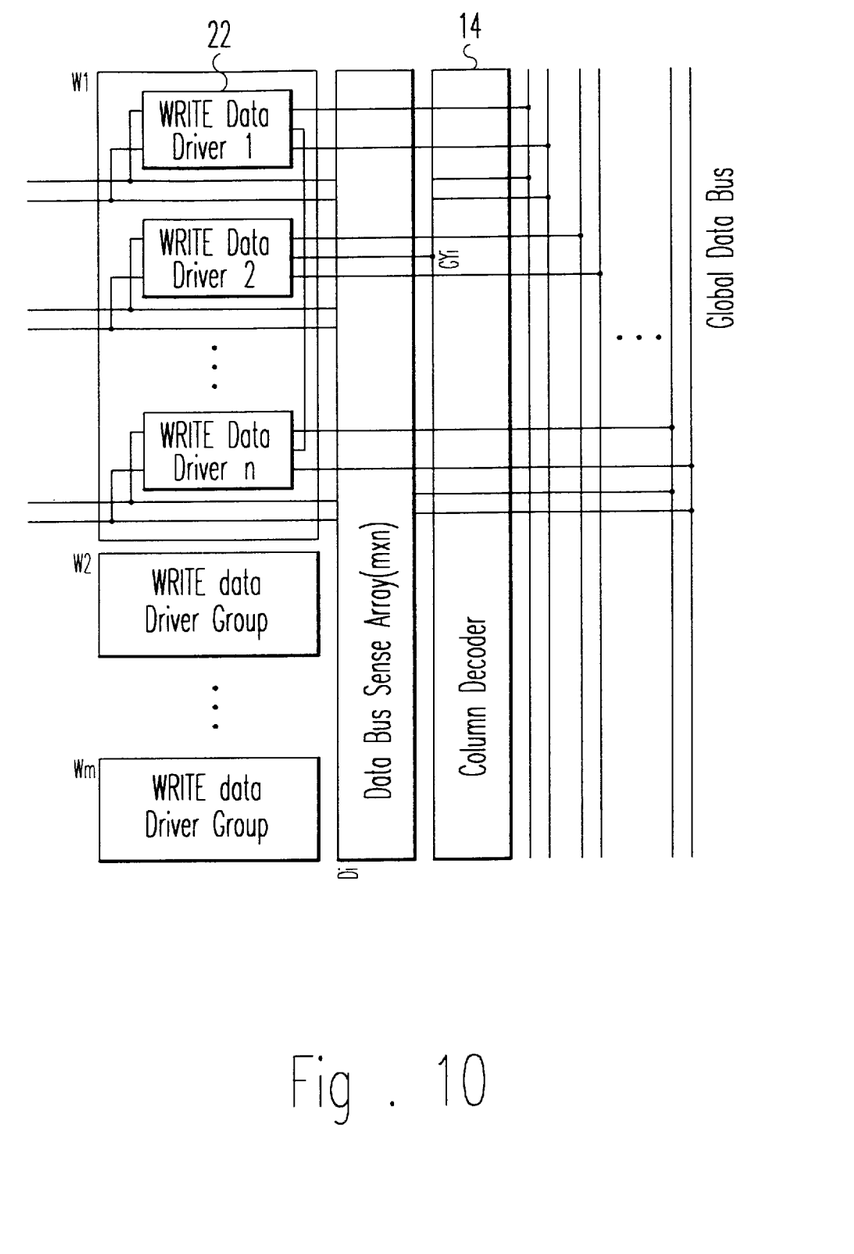
FIG. 10 is a circuit view showing an embodiment of a data write path of the present invention.

FIG. 10 is a circuit view showing an embodiment of a data write path of the present invention.

Since there are mn Write Data Drivers (WDD) for mn local data buses, by n WDDs having GYi signal of an output signal of a column decoder in common, mn local data buses are divided into m WDD blocks Wi ($1 \leq i \leq m$).

Accordingly, n WDDs pertaining to m WDD blocks Wi perform a write operation by being simultaneously connected to a global data bus by means of GYi, and driving the transferred data to a local data bus.

As described above, if a semiconductor memory device having a data bus line structure suitable for a high-speed burst read/write operation of the present invention is applied to a super-high integrated memory device of gigabit degree, data can be continuously read without interrupting between burst data when access to 2 continuous row address can be performed if a burst length is enough long. Therefore, it is possible to improve the efficiency of a burst read, and prefetch a plurality of data on DBSA array adjacent to a column decoder by means of a local data bus displaced in a metal line over a cell array. As a result, a column address can operate quickly (a prefetch means what is previously latching a bundle of data to be output) . A high channel width burst read/write operation can be performed by being applied to data bus structure of SDRAM without increasing the area of a chip.

It will be apparent to those skilled in the art that various modification and variations can be made in a semiconductor memory device having a data bus line structure suitable for a high-speed burst read/write operation of the present invention without departing from the spirit and scope of the invention. Thus, it is intended that the present invention cover the modification and variation of this invention provided that they come within the scope of the appended claims and their equivalents.

What is claimed is:

1. A semiconductor memory device, said device comprising:
   a bit line sense amplifier array composed of K bit line sense amplifiers divided into $2^n$ in a column direction, wherein K and n are integers;
   $K/2^n$ local data bus lines held in common on said bit line sense amplifier array of said same column direction and displaced to pass over a cell array and said bit line sense amplifier array;
   a sub column decoder connected to said bit line sense amplifier array so that one bit line sense amplifier per $2^n$ bit line sense amplifiers on said each bit line sense amplifier array can be connected with said local data bus lines;
   switch means for connecting said bit line sense amplifier selected by an output of $2^n$ sub column decoders per said each bit line sense amplifier array with said local data bus line; and
   $K/2^n$ data bus sense amplifiers connected to said $K/2^n$ local data lines to pre-read $X/2^n$ bit line amplifier data selected by a column decoder output.

2. The semiconductor memory device according to claim 1, wherein: n is an integral number greater than or equal to 0.

3. The semiconductor memory device according to claim 1, wherein:
   said sub column decoder is selected by a block selective signal when said bit line sense amplifier array is divided into $2^n$, and decodes by receiving n column addresses as an input.

4. The semiconductor memory device according to claim 1, wherein:
   said switch means are selected by a block selective signal when said bit line sense amplifier array is divided into $2^n$, receives $2^n$ signals which n column addresses are decoded and holds $2^n$ signals decoded at every said sub column decoder in common.

5. The semiconductor memory device according to claim 1, wherein:
   said sub column decoder is that one sub column decoder among sub column decoders connected to said bit line sense amplifier array is activated.

6. A semiconductor memory device, said device comprising:
   a bit line sense amplifier array composed of K bit line sense amplifiers divided into $2^n$ in a column direction, wherein K and n are integers;
   all $2K/2^n$ local data bus lines having a bit line sense amplifier group of the same column direction every array in common and displaced to pass over a cell array and said bit line sense amplifier array;
   a sub column decoder connected to both sides of said cell array so that one bit line sense anplifier per $2^n$ on said each bit line sense amplifier away can be connected with said local data bus line;
   switch means for connecting said bit line sense amplifier selected by an output of $2^n$ sub column decoders per said each bit line sense amplifier array with said local data bus line; and
   $2K/2^n$ data bus sense amplifiers connected to said $2K/2^n$ local data lines to pre-read $2K/2^n$ bit line sense amplifier data selected by said column decoder output;
   wherein data transferred to said local data bus line are latched after being sensed by data bus sense amplifiers connected to each local data bus line.

7. The semiconductor memory dice according to claim 6, wherein:
   n is an integral number greater than or equal to 0.

8. The semiconductor memory device according to claim 6, wherein:
   said sub column decoder are selected by a block selective signal when said bit line sense amplifier array into $2^n$, and decodes by receiving n column addresses.

9. The semiconductor memory device according to claim 6, wherein:
   said switch means is selected by a block selective signal when said bit line sense amplifier array is divided into $2^n$, receives $2^n$ signals which n column addresses are decoded and holds $2^n$ signals decoded each said column decoder in common.

10. The semiconductor memory device according to claim 6, wherein:
    said sub column decoder is that said subcolumn decoder connected to both sides of said bit line sense amplifier array of a cell array to which said access word line pertains is activated.

11. A semiconductor memory device having a data bus sense amplifier array composed of m×2n data bus sense amplifiers, wherein m and n are integers, said device comprising:
    one block being divided into m data bus sense amplifier blocks by regarding 2n data bus sense amplifiers holding an output of a column decoder in common as one block; and
    n date bus sense amplifiers among 2n bit line sense amplifiers pertaining to said data bus sense amplifier block transferring stored data by being simultaneously connected to n global data buses means of the output of said column decoder and an output selector;

said transferred data having a data read path for being transferred to a data pin through a data output driver after being received on a read data buffer;

wherein said data bus sense amplifiers include:
1) a first data sense amplifier group performing a burst read operation by being connected with n global data bus means of the output of said column decoder and an output selector; and
2) a second data bus sense amplifier group simultaneously performing receiving data of the m×n line sense amplifiers selected by being connected to m×n local data buses by means of the output of an input selector.

12. The semiconductor memory device according to claim 11, wherein each data bus sense amplifier of said data bus sense amplifier block has 4 latches, including:

a first latch among the 4 latches being connected to each data bus sense amplifier by an input selector, data sensed by said data bus sense amplifiers latched;

a second latch performs a burst read operation by being connected with a global data bus by means of the output of an output selector and a column decoder.

13. A semiconductor memory device having a data bus sense amplifier array composed of m×n data bus sense amplifiers, wherein m and n are integers said device comprising:

one block being divided into m data bus sense amplifier blocks by regarding n data bus sense amplifiers holding an output of a column decoder in common as one block;

n bit line sense amplifiers pertaining to said data bus sense amplifier block transferring stored data by being simultaneously connected to n global data buses by an output of said column decoder;

said transferred data having a data read path for being transferred to a data pin through a data output driver after being received on a read data buffer.

14. A semiconductor memory device having a data bus sense amplifier array composed of m×2n data bus sense amplifiers, wherein m and n are integers, said device comprising:

one block being divided into m data bus sense amplifier blocks by regarding 2n data bus sense amplifiers holding an output of a column decoder in common as one block; and n data bus sense amplifiers among 2n bit line sense amplifiers pertaining to said data bus sense amplifier block transferring stored data by being simultaneously connected to n global data buses means of the output of said column decoder and an output selector;

wherein said transferred data has a data read path for being transferred to a data pin through a data output driver after being received on a read data buffer; and wherein each data bus sense amplifier of said data bus sense amplifier block includes:
1) a first latch being connected to each data bus sense amplifier by an input selector, data sensed by said data bus sense amplifier is latched;
2) a second latch performing a burst read operation by being connected with a global data bus by means of the output of an output selector and a column decoder.

* * * * *